(12) United States Patent
Chen et al.

(10) Patent No.: US 9,305,843 B2
(45) Date of Patent: Apr. 5, 2016

(54) CHIP PACKAGE AND METHOD FOR FORMING THE SAME

(71) Applicant: XINTEC INC., Jhongli, Taoyuan County (TW)

(72) Inventors: Bing-Siang Chen, Taipei (TW); Chien-Hui Chen, Zhongli (TW); Shu-Ming Chang, New Taipei (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/596,185

(22) Filed: Jan. 13, 2015

(65) Prior Publication Data

US 2015/0162245 A1 Jun. 11, 2015

Related U.S. Application Data

(62) Division of application No. 13/452,595, filed on Apr. 20, 2012, now abandoned.

(30) Foreign Application Priority Data

Apr. 21, 2011 (CN) .......................... 2011 1 0102543

(51) Int. Cl.

| H01L 23/48 | (2006.01) |
|---|---|
| H01L 21/00 | (2006.01) |
| H01L 21/44 | (2006.01) |
| H01L 21/78 | (2006.01) |
| H01L 25/065 | (2006.01) |
| H01L 25/00 | (2006.01) |

(52) U.S. Cl.
CPC ............ *H01L 21/78* (2013.01); *H01L 25/0657* (2013.01); *H01L 25/50* (2013.01); *H01L 2224/16* (2013.01); *H01L 2225/06513* (2013.01); *H01L 2225/06582* (2013.01); *H01L 2924/13091* (2013.01); *H01L 2924/1461* (2013.01)

(58) Field of Classification Search
CPC ..... H01L 21/78; H01L 25/0657; H01L 25/50; H01L 2224/16; H01L 2225/06582; H01L 224/130919; H01L 2924/00
USPC .......... 257/737, 686, 774, E23.068, E21.599; 438/113, 667
See application file for complete search history.

(56) References Cited

U.S. PATENT DOCUMENTS

| 2005/0046002 | A1* | 3/2005 | Lee ................... H01L 21/76898 257/678 |
| 2008/0272504 | A1* | 11/2008 | Do ......................... H01L 21/568 257/797 |
| 2009/0098684 | A1* | 4/2009 | Kroeninger ......... H01L 21/6835 438/114 |
| 2010/0140784 | A1* | 6/2010 | Atkinson ............ H01L 23/5389 257/692 |
| 2010/0320258 | A1 | 12/2010 | Sawada et al. |
| 2011/0254173 | A1* | 10/2011 | Do .................... H01L 21/76898 257/774 |

* cited by examiner

*Primary Examiner* — Long K Tran
*Assistant Examiner* — Dzung Tran
(74) *Attorney, Agent, or Firm* — Liu & Liu (57) ABSTRACT

An embodiment of the invention provides a chip package which includes: a first chip; a second chip disposed on the first chip, wherein a side surface of the second chip is a chemically-etched surface; and a bonding bulk disposed between the first chip and the second chip such that the first chip and the second chip are bonded with each other.

10 Claims, 13 Drawing Sheets

CHIP PACKAGE AND METHOD FOR FORMING THE SAME

CROSS REFERENCE TO RELATED APPLICATIONS

This Application is a Division of U.S. application Ser. No. 13/452,595, filed on Apr. 20, 2012, which claims priority of China Patent Application No. 201110102543.0, filed on Apr. 21, 2011, the entirety of which are incorporated by reference herein.

BACKGROUND OF THE INVENTION

1. Field of the Invention

The present invention relates to a chip package, and in particular relates to a chip package having at least two stacked chips and method for forming the same.

2. Description of the Related Art

Fabrication processes for chip packages are important for forming electronic products. A chip package not only provides protection for the chips from environmental contaminants, but also provides a connection interface for chips packaged therein.

Because the size and the thickness of a chip are continuing to decrease, process difficulty of the chip package has accordingly increased. It has become an important issue to prevent the chip from being damaged during the packaging process and improve the reliability and the structural stability of the chip package, as size and thickness of chips continue to decrease.

BRIEF SUMMARY OF THE INVENTION

According to an embodiment of the invention, a chip package is provided. The chip package includes: a first chip; a second chip disposed on the first chip, wherein a side surface of the second chip is a chemically-etched surface; and a bonding bulk disposed between the first chip and the second chip such that the first chip and the second chip are bonded with each other.

According to an embodiment of the invention, a method for forming a chip package is provided. The method includes: providing a first substrate; providing a second substrate; forming at least a bonding bulk on an upper surface of the first substrate and/or on a lower surface of the second substrate; bonding the second substrate onto the first substrate through the bonding bulk; forming a first protection layer on an upper surface of the second substrate, wherein the first protection layer has an opening exposing a predetermined scribe region of the second substrate; using the first protection layer as a mask to etch and remove a portion of the second substrate located in the predetermined scribe region to form a through-hole exposing the first substrate; and partially removing the first substrate exposed by the through-hole to form at least one chip package.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of stacked chips. For example, the chip package of the embodiments of the invention may be applied to the package structure of the stack of the following illustrated chips which include, for example, active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1A:
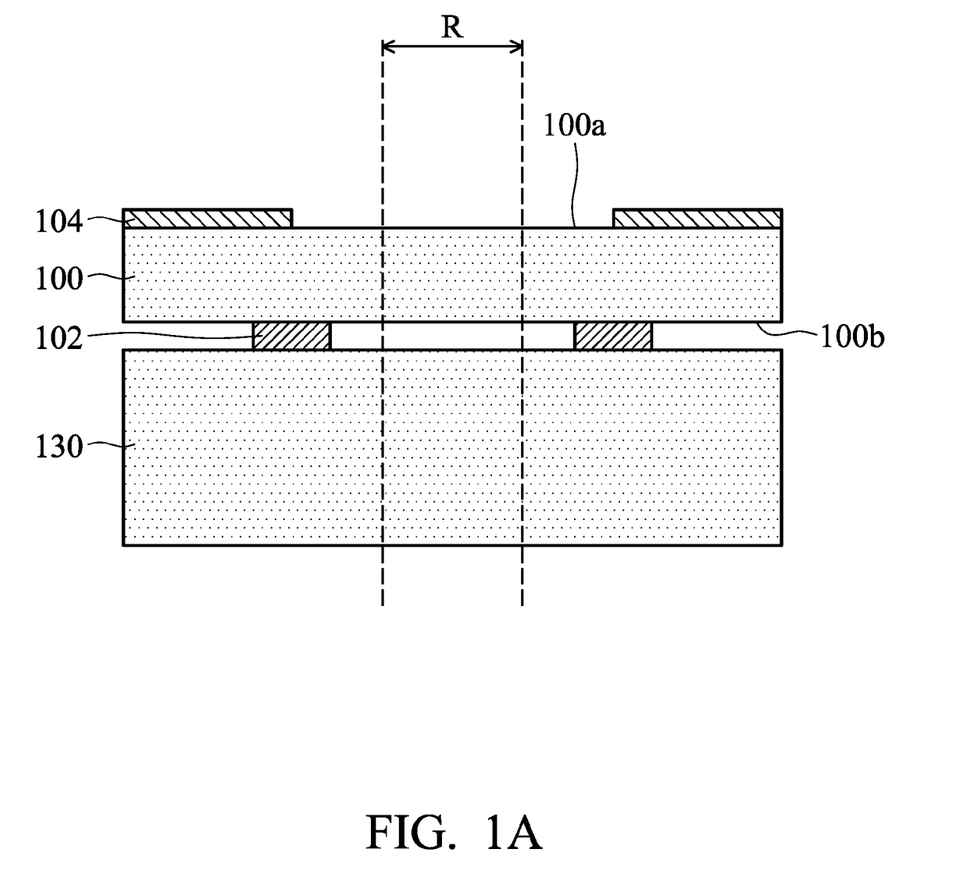
FIGS. 1A-1F are cross-sectional views showing the steps of forming a chip package according to an embodiment of the present invention.

FIGS. 1A-1F are cross-sectional views showing the steps of forming a chip package according to an embodiment of the present invention. As shown in FIG. 1A, a substrate 100 and a substrate 130 are provided. The substrate 100 and the substrate 130 may be two semiconductor wafers. For example, the substrate 100 may be (but is not limited to) a wafer including a plurality of control ICs, wherein a plurality of predetermined scribe lines or predetermined scribe regions are defined thereon to define a plurality of regions of the substrate 100. The regions may be formed with control ICs, respectively. The control ICs may include CMOS elements. As shown in FIG. 1A, at least a predetermined scribe region R is defined in the substrate 100, which defines into a plurality of regions of the substrate 100. Electronic elements such as (but is not limited to) control ICs may be formed in each of the regions.

The substrate 130 may be (but is not limited to) a wafer including a plurality of MEMS elements, wherein a plurality of predetermined scribe lines are defined thereon to define a plurality of regions of the substrate 130. Each of the regions may be formed with MEMS elements. In the substrate 130, holes or recesses needed for the operation of the MEMS elements may be formed.

As shown in FIG. 1A, the substrate 100 is then bonded onto the substrate 130. In one embodiment, a bonding bulk 102 may be formed on a surface of the substrate 130. In the embodiment shown in FIG. 1A, the bonding bulk 102 does not extend into the predetermined scribe region R. Then, the substrate 100 is bonded onto the substrate 130 through the bonding bulk 102. In another embodiment, the bonding bulk 102 may be formed on the surface 100b of the substrate 100. Then, through the bonding bulk 102, the substrate 100 is bonded onto the substrate 130. In yet another embodiment, bonding layers are formed on surfaces of both the substrate 100 and the substrate 130. Then, through the bonding of the two bonding layers, the substrate 100 is bonded onto the substrate 130, wherein the two bonding layers together form the bonding bulk between the two substrates. In one embodiment, the bonding method of the bonding bulk 102 with the substrate 100 and/or the substrate 130 may include a metal to metal bonding (such as an eutectic bonding), metal to semiconductor bonding, metal to insulator bonding, semiconductor to insulator bonding, semiconductor to semiconductor bonding, or insulator to insulator bonding method, or combinations thereof. In one embodiment, the bonding bulk 102 is two bonded bonding layers. The bonding method between the two bonding layers may include, for example, a metal to metal bonding (such as an eutectic bonding), metal to semiconductor bonding, metal to insulator bonding, semiconductor to insulator bonding, semiconductor to semiconductor bonding, or insulator to insulator bonding method, or combinations thereof.

In one embodiment, the material of the bonding bulk 102 may be a metal material such as gold, copper, aluminum, or the like. Alternatively, the material of the bonding bulk 102 may be a semiconductor material such as silicon, germanium, or the like. Alternatively, the material of the bonding bulk 102 may be an oxide, nitride, or polymer material. In one embodiment, because the bonding bulk 102 is disposed between the substrate 100 and the substrate 130, the substrate 100 and the substrate 130 are not directly in contact with each other and are separated from each other by a distance. In one embodiment, the bonding bump 102 is a conductive bulk. In this case, electronic elements in the substrate 100 and the substrate 130 may transmit signals to each other through the bonding bulk 102. In addition, in one embodiment, a conducting region 104 may be formed on the surface 100a of the substrate 100. The conducting region 104 may be electrically connected to electronic elements in the substrate 100.

Figure 1B:
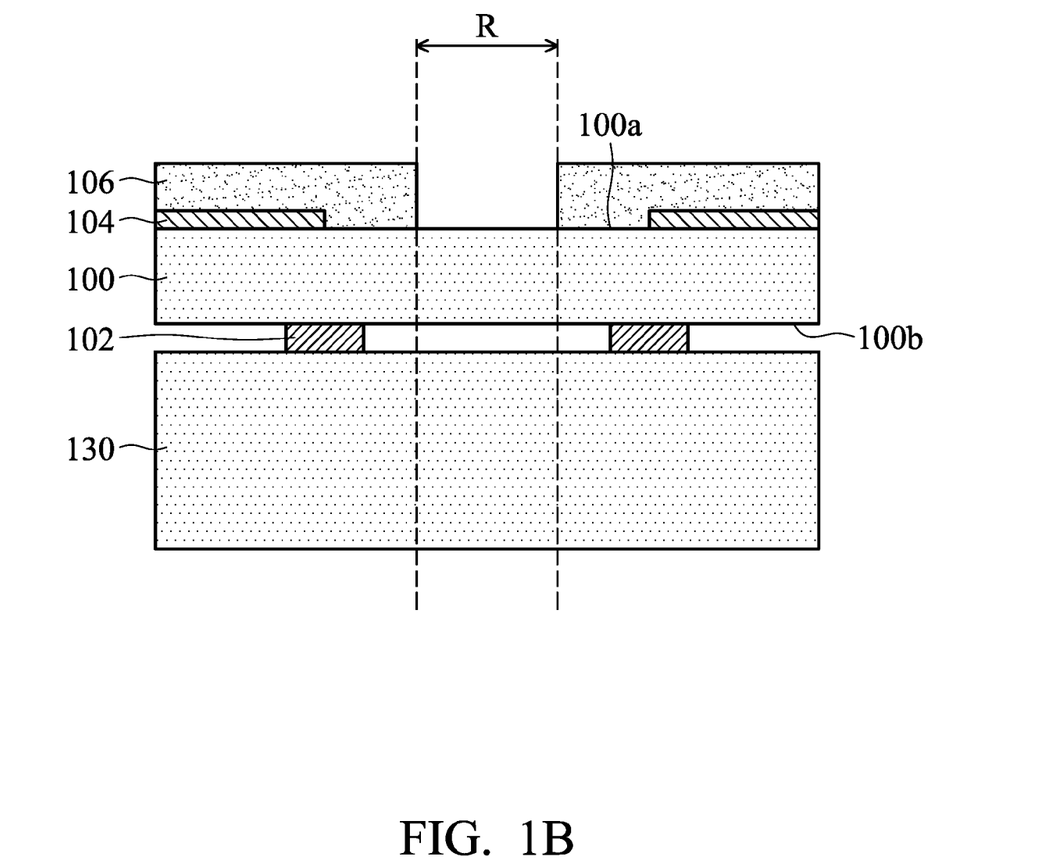

Next, as shown in FIG. 1B, a protection layer 106 is formed on the surface 100a of the substrate 100. The protection layer 106 may partially cover the surface 100a, and only the predetermined scribe region R is exposed. As shown in FIG. 1B, the protection layer 106 may protect the conducting region 104 thereunder and have an opening exposing the predetermined scribe region R. In one embodiment, the protection layer 106 may be a patterned photoresist layer or another suitable protection material.

Figure 1C:
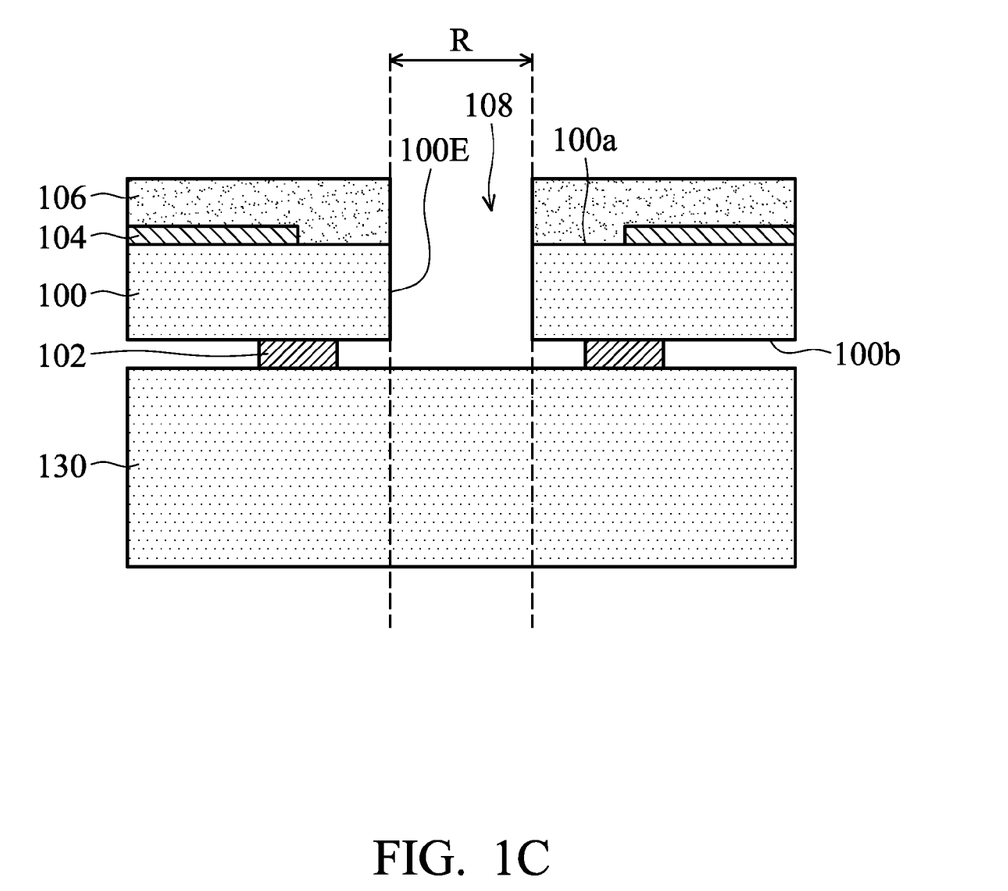

As shown in FIG. 1C, the protection layer 106 is then used as a mask, and an etching process is performed to the exposed substrate 100 to remove the portion of the substrate 100 located in the predetermined scribe region R such that a through-hole 108 exposing the substrate 130 is formed. In one embodiment, the through-hole 108 is actually a trench which extends along, for example, the predetermined scribe line of the wafer. The etching process mentioned above may also be called a pre-dicing process. A suitable etching process includes a wet etching process, dry etching process, or combinations thereof. Because the protection layer 106 is previously formed on the surface 100a of the substrate 100, the regions of the protection layer 106 other than the predetermined scribe region of the substrate 100 are not damaged by the etching process. For example, the conducting region 104 may be protected by the protection layer 106 without being etched. After the dicing process is performed, a side surface 100E of the substrate 100 may be formed. The side surface 100E of the substrate 100 is a chemically-etched surface. In one embodiment, through a surface detecting technology, a microstructure or bonding of the side surface 100E of the substrate 100 may be observed to confirm that the side surface 100E of the substrate 100 is a chemically-etched surface.

In one embodiment, the thickness of the substrate 100 is thinner, and is suspended near the predetermined scribe region R. For example, in FIG. 1C, the thickness of the substrate 100 is smaller than the thickness of the substrate 130, and the two substrates are separated from each other by a cavity. In this case, an etching process is used to form the through-hole 108, and thus damage of the substrate 100 may be prevented. In another way known by the inventor, a dicing blade is used to cut the substrate 100 along the predetermined scribe lines of the wafer. In this case, the substrate 100 may be easily broken due to the dicing process, which affects reliability of the chip obtained by dicing.

Figure 1D:
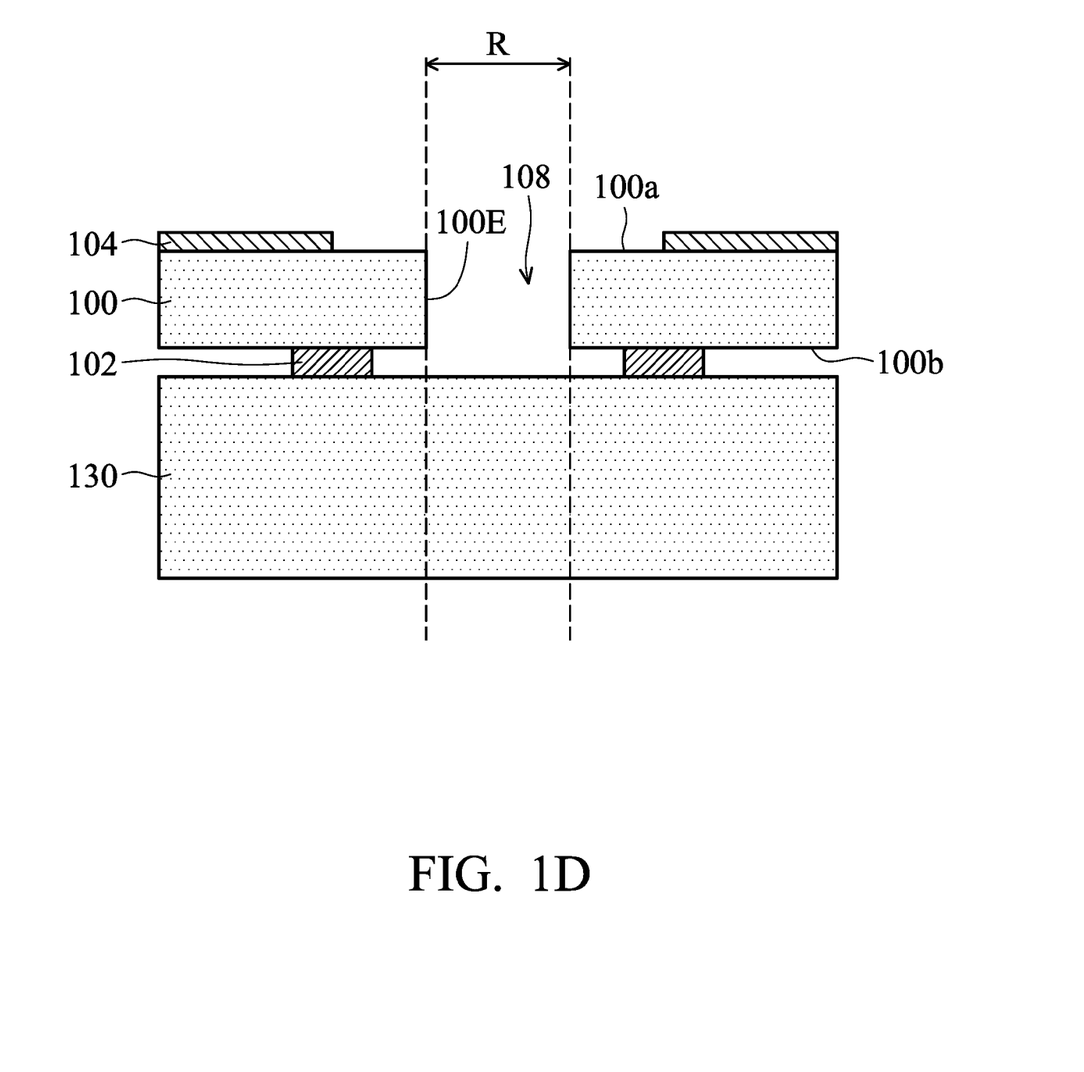

As shown in FIG. 1D, in one embodiment, after the through-hole 108 is formed, the protection layer may be optionally removed. After the etching process (also called pre-dicing process) of the substrate 100 is performed, the substrate 100 may be divided into a plurality of isolated regions separated from each other. The regions may be formed with electronic elements, respectively. The electronic elements may include control ICs. The separate and isolated regions are a plurality of chips. Thus, the reference number 100 can also be used to designate the chip.

Figure 1E:
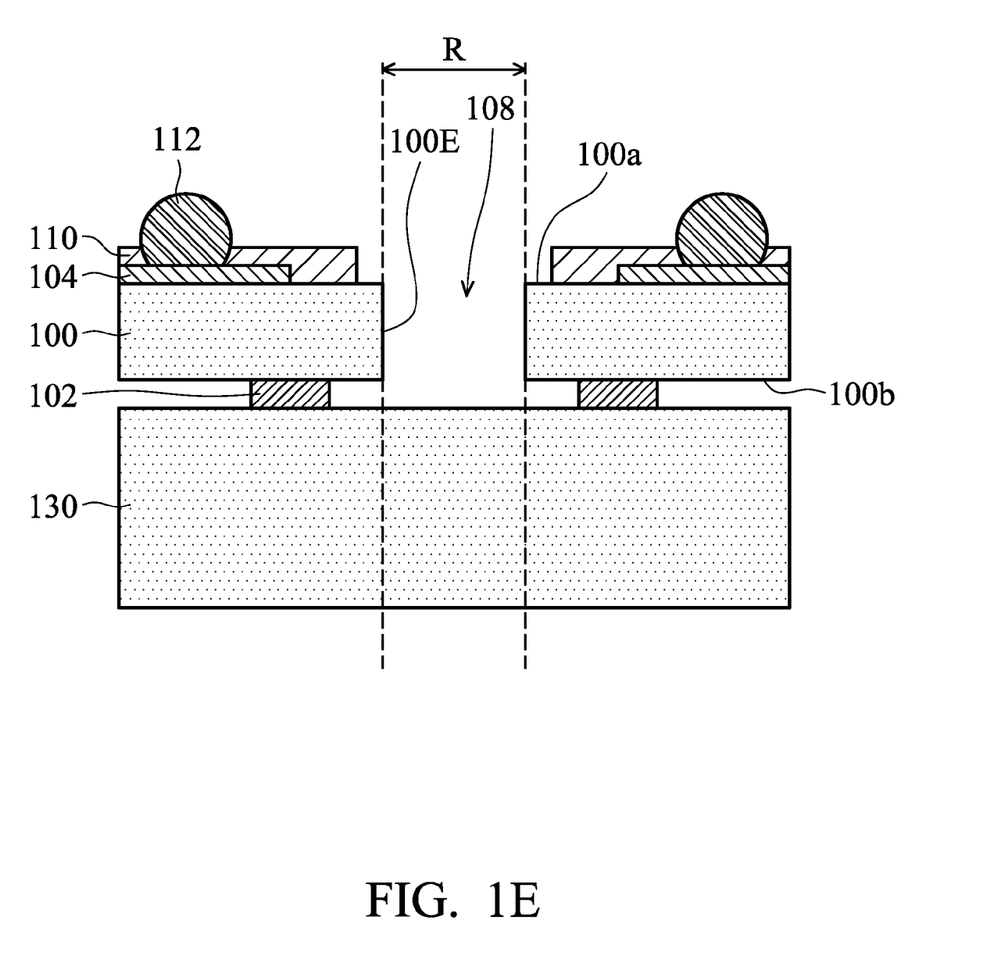

Next, as shown in FIG. 1E, a protection layer 110 may be optionally formed on the surface 100a of the substrate 100 (or the chip 100). The protection layer 110 may have openings exposing the conducting regions 104. The material of the protection layer 110 may be, for example, a solder mask material or insulating material. Then, conducting bumps 112 are formed on the exposed conducting regions 104. The conducting bump 112 may be electrically connected to the electronic elements in the chip 100 through the conducting region 104. However, it should be appreciated that the formation steps of forming the protection layer 110 and the conducting bump 112 are not limited to be performed at this stage. In another embodiment, the protection layer 110 and the conducting bump 112 may also be performed at another stage. For example, in another embodiment, the protection layer 110 and the conducting bump 112 may be formed before the through-hole 108 is formed.

Figure 1F:
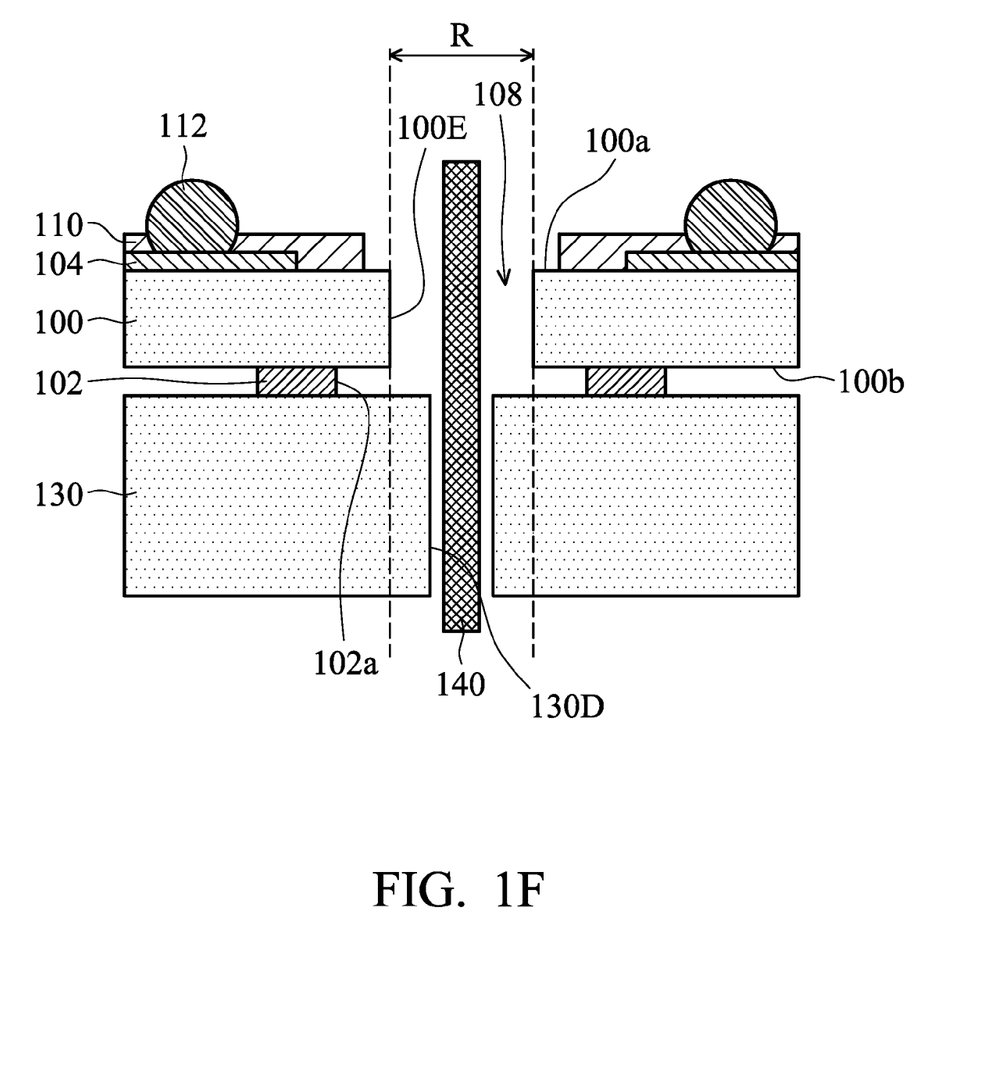

As shown in FIG. 1F, a subsequent dicing process is then performed to form a plurality of chip packages separated from each other. In one embodiment, the substrate 130 exposed by the through-hole 108 is partially removed to divide the substrate 130 into a plurality of isolated regions separated from each other. The regions may be formed with electronic elements, respectively. The electronic elements may include, for example, MEMS elements. The separate and isolated regions are a plurality of chips. Thus, the reference number 130 may also be used to designate the chip.

In one embodiment, an etching process may be used to accomplish the dicing process of the substrate 130. In this case, a side surface 130D of the substrate 130 (or the chip 130) is a chemically-etched surface. In another embodiment, as shown in FIG. 1F, a dicing blade 140 may be used to cut through the substrate 130. In this case, the side surface 130D of the substrate 130 (or the chip 130) is a diced surface. In one embodiment, through a surface detecting technology, a microstructure or bonding of the side surface 130D of the substrate 130 (or the chip 130) may be observed to confirm that the side surface 130D of the substrate 130 (or the chip 130) is a diced surface. In one embodiment, the roughness of the side surface 100E of the substrate 100 (or the chip 100) is lesser than the roughness of the side surface 130D of the substrate 130 (or the chip 130). In another embodiment, the roughness of the side surface 100E of the substrate 100 (or the chip 100) is greater than the roughness of the side surface 130D of the substrate 130 (or the chip 130). Depending on different etching ways, materials to be etched, sizes, and/or dicing conditions, the side surface 100E and the side surface 130D may have different roughnesses. However, it should be appreciated that in yet another embodiment, the roughness of the side surface 100E of the substrate 100 (or the chip 100) may be substantially equal to the roughness of the side surface 130D of the substrate 130 (or the chip 130).

In one embodiment, after a dicing process is performed to the originally stacked wafers, at least a chip package is thus formed. As shown in FIG. 1F, in this embodiment, a side surface 102a of the bonding bulk 102 closest to the side surface 100E of the chip 100 is not coplanar with the side surface 100E of the chip 100. In this embodiment, the side surface 102a of the bonding bulk 102 retreats to the inner portion of the chip package. In addition, in one embodiment, a width (or a thickness) of the dicing blade 140 may be smaller than a width if the predetermined scribe region R. Thus, in the obtained chip package, the chip 130 has a width larger than that of the chip 100.

Embodiments of the invention may have many other variations. FIGS. 2A-2F are cross-sectional views showing the steps of forming a chip package according to an embodiment of the present invention, wherein same or similar reference numbers are used to designate same or similar elements.

Figure 2A:
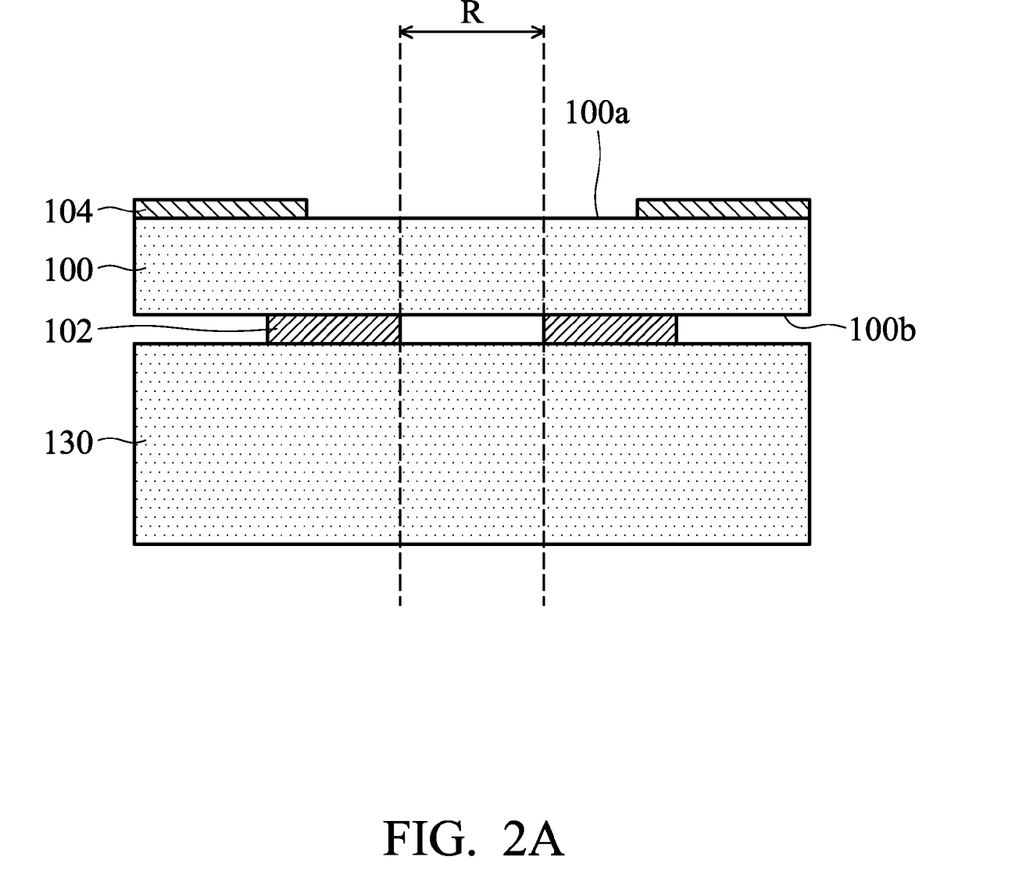
FIGS. 2A-2F are cross-sectional views showing the steps of forming a chip package according to an embodiment of the present invention.

As shown in FIG. 2A, similar to FIG. 1A, two stacked substrates 100 and 130 are provided, wherein bonding bulks 102 are disposed between the two substrates. In the embodiment shown in FIG. 2A, a side surface of the bonding bulk 102 is substantially coplanar with a boundary of a predetermined scribe region R.

Figure 2B:
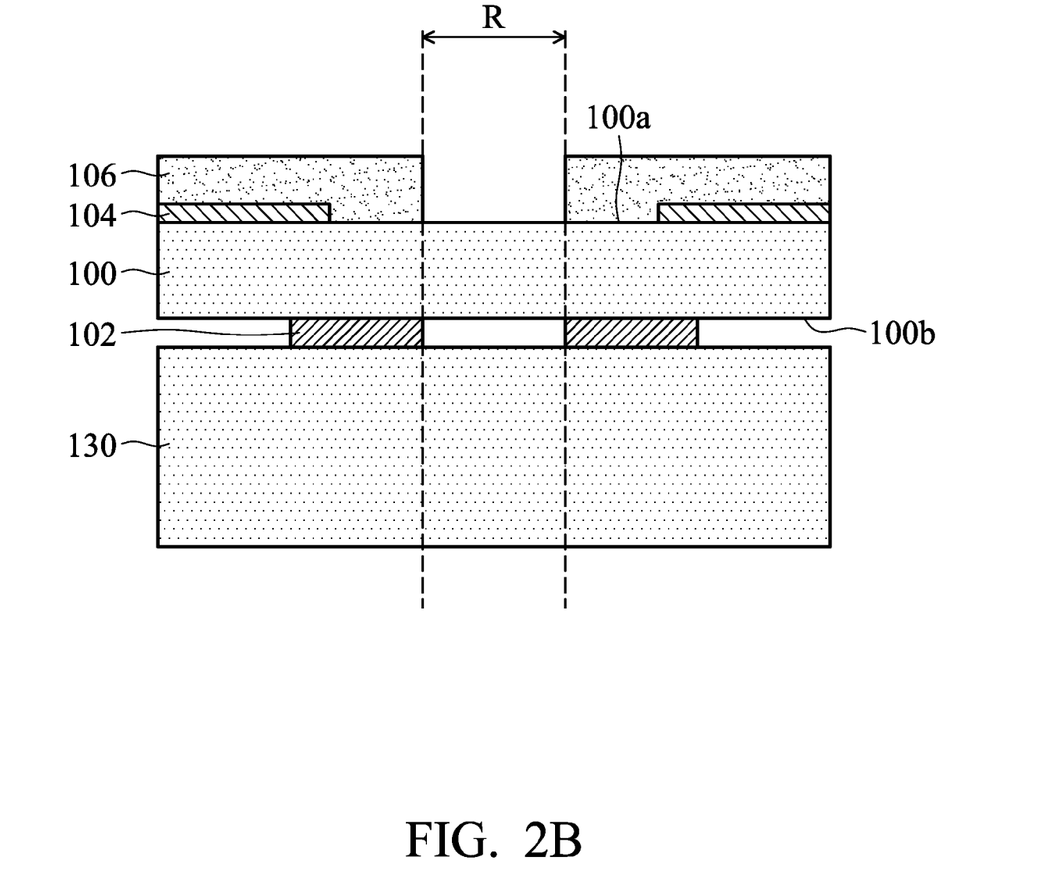

Next, as shown in FIG. 2B, a protection layer 106 is formed on a surface 100a of the substrate 100 to cover conducting regions 104 thereunder, and the substrate 100 in the predetermined scribe region R is exposed.

Figure 2C:
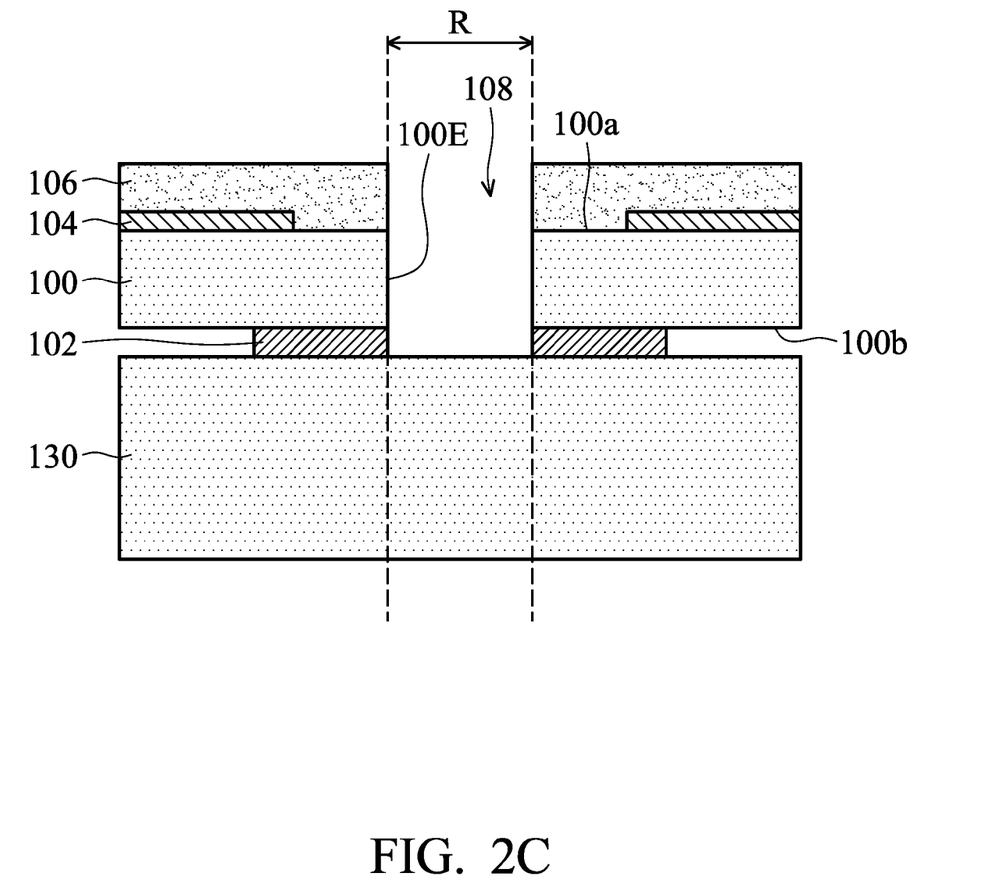

As shown in FIG. 2C, the protection layer 106 is then used as a mask, and an etching process is performed to the exposed substrate 100 to remove the portion of the substrate 100 located in the predetermined scribe region R such that a through-hole 108 exposing the substrate 130 is formed. In one embodiment, the through-hole 108 is actually a trench which extends along, for example, the predetermined scribe line of the wafer. The etching process mentioned above may also be called a pre-dicing process. A suitable etching process may include a wet etching process, dry etching process, or combinations thereof. The side surface 100E of the substrate 100 is a chemically-etched surface. In one embodiment, because the bonding bulk 102 may substantially surround the predetermined scribe region R, in the step of etching and removing the substrate 100 in the predetermined scribe region R to form the through-hole 108, structures formed on the substrate 130 can be protected by the bonding bulk 102 and be prevented from being etched and removed.

Figure 2D:
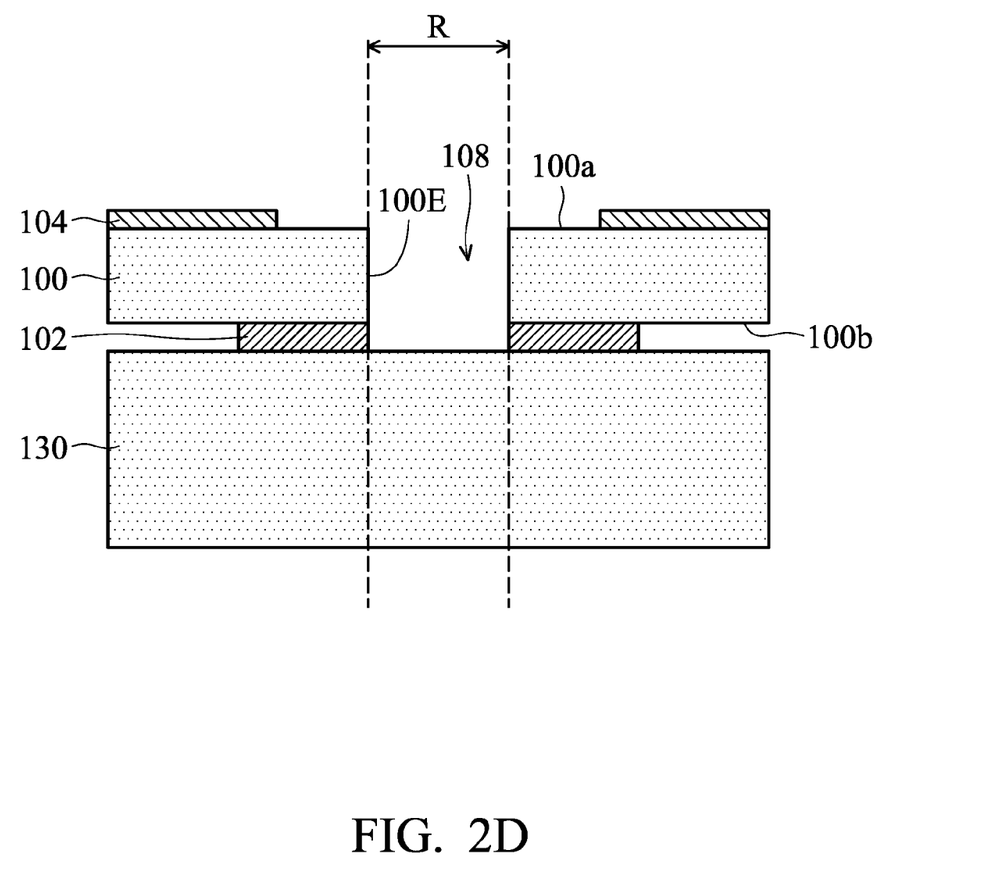

As shown in FIG. 2D, in one embodiment, after the through-hole 108 is formed, the protection layer 106 may be optionally removed. After the etching process (or called pre-dicing process) is performed, the substrate 100 may be divided into a plurality of isolated regions separated from each other. The regions may be formed with electronic elements, respectively. The electronic elements may include, for example, control ICs. The separate and isolated regions are a plurality of chips. Thus, the reference number 100 may also be used to designate the chip.

Figure 2E:
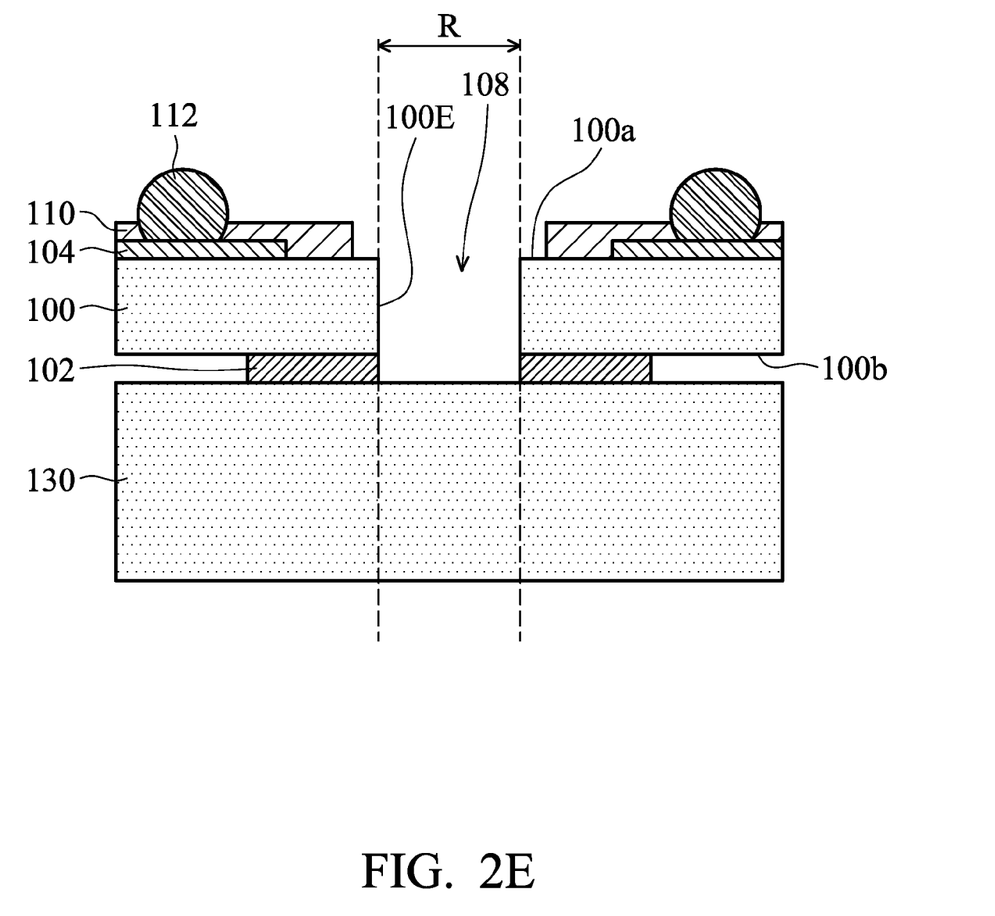

Next, as shown in FIG. 2E, a protection layer 110 and conducting bumps 112 electrically connected to the electronic elements in the chip 100 may be optionally formed on the surface 100a of the substrate 100 (or the chip 100).

Figure 2F:
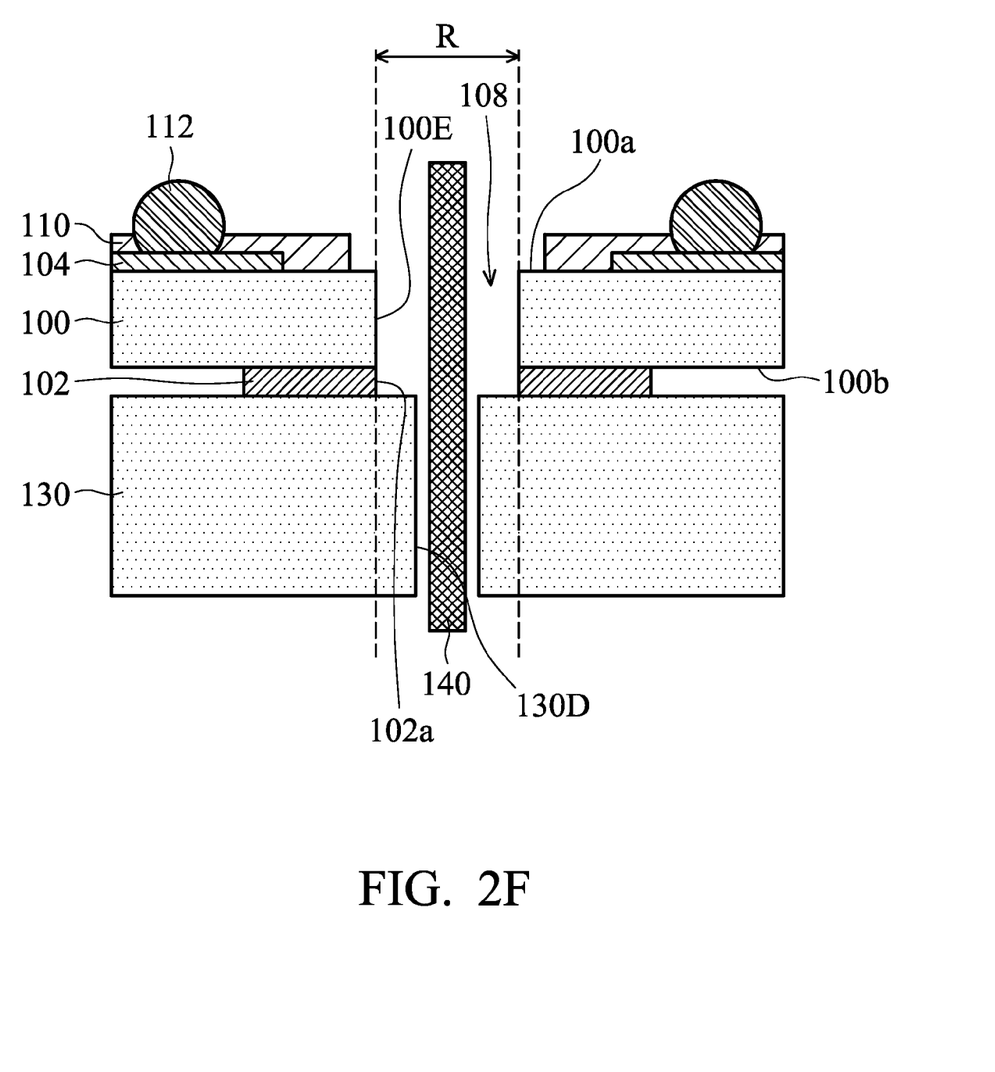

As shown in FIG. 2F, a subsequent dicing process is then performed to form a plurality of chip packages separated from each other. In one embodiment, the substrate 130 exposed by the through-hole 108 is partially removed to divide the substrate 130 into a plurality of isolated regions separated from each other. The regions may be formed with electronic elements, respectively. The electronic elements may include, for example, MEMS elements. The separate and isolated regions are a plurality of chips. Thus, the reference numbers 130 may also be used to designate the chip.

In one embodiment, an etching process may be used to accomplish the dicing process of the substrate 130. In this case, a side surface 130D of the substrate 130 (or the chip 130) is a chemically-etched surface. In another embodiment, as shown in FIG. 2F, a dicing blade 140 may be used to cut through the substrate 130. In this case, the side surface 130D of the substrate 130 (or the chip 130) is a diced surface.

In one embodiment, after a dicing process is performed to the originally stacked wafers, at least a chip package is thus formed. As shown in FIG. 2F, in this embodiment, a side surface 102a of the bonding bulk 102 closest to the side surface 100E of the chip 100 is substantially coplanar with the side surface 100E of the chip 100. In this embodiment, the side surface 102a of the bonding bulk 102 is substantially coplanar with the side surface 100E of the chip 100.

Embodiments of the invention may have many other variations. For example, FIG. 3 is a cross-sectional view showing a chip package according to an embodiment of the present invention, wherein same or similar reference numbers are used to designate same or similar elements.

Figure 3:
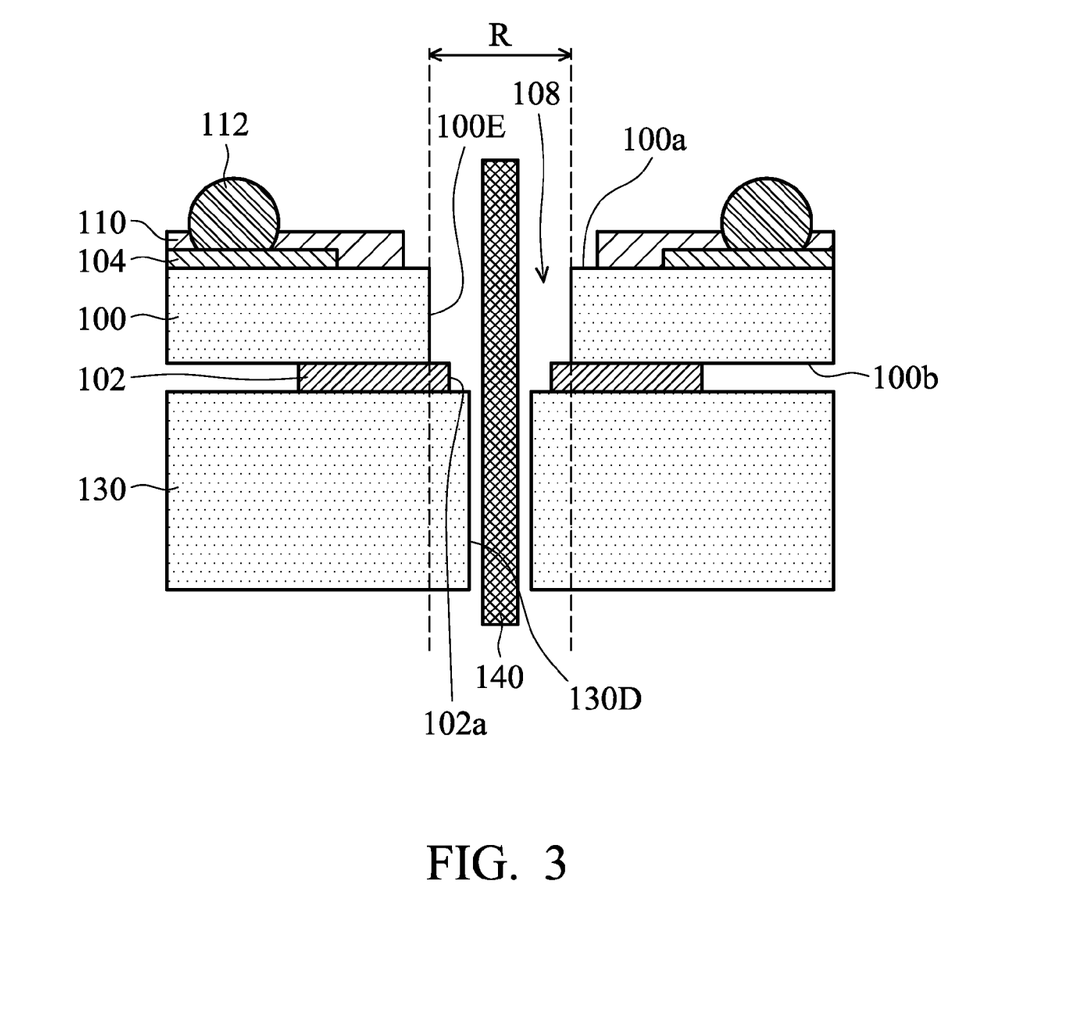
FIG. 3 is a cross-sectional view showing the steps of forming a chip package according to an embodiment of the present invention.

As shown in FIG. 3, the embodiment is similar to the embodiment shown in FIG. 2, wherein the main difference is that the bonding bulk 102 extends into the predetermined scribe region R. Thus, in the formed chip package, the side surface 102a of the bonding bulk 102 protrudes from the side surface 100E of the chip 100.

The chip package of the embodiments of the invention may have a better reliability, which may decrease the probability of being damaged of the chip during the packaging process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
   providing a first substrate;
   providing a second substrate;
   forming at least a bonding bulk on an upper surface of the first substrate and/or on a lower surface of the second substrate;
   bonding the second substrate onto the first substrate through the bonding bulk;
   forming a first protection layer on an upper surface of the second substrate, wherein the first protection layer has an opening exposing a predetermined scribe region of the second substrate;
   using the first protection layer as a mask to chemically-etch and remove a portion of the second substrate located in the predetermined scribe region to form a through-hole exposing the first substrate; and
   partially removing the first substrate exposed by the through-hole to form at least one chip package.

2. The method for forming a chip package as claimed in claim 1, wherein the step of partially removing the first substrate exposed by the through-hole to form at least one chip package comprises using a dicing blade to cut through the first substrate.

3. The method for forming a chip package as claimed in claim 2, wherein a width of the dicing blade is smaller than that of the predetermined scribe region.

4. The method for forming a chip package as claimed in claim 1, wherein the step of partially removing the first substrate exposed by the through-hole to form at least one chip package comprises using a chemically-etching process to remove the exposed first substrate such that the first substrate is divided into a plurality of sections.

5. The method for forming a chip package as claimed in claim 1, wherein the bonding bulk extends into the predetermined scribe region.

6. The method for forming a chip package as claimed in claim 1, wherein the bonding bulk does not extend into the predetermined scribe region.

7. The method for forming a chip package as claimed in claim 1, wherein a side surface of the bonding bulk is coplanar with a boundary of the predetermined scribe region.

8. The method for forming a chip package as claimed in claim 1, further comprising:
   forming a second protection layer on the second substrate, wherein the second protection layer has an opening exposing a conducting region on the second substrate; and
   forming a conducting bump on the exposed conducting region.

9. The method for forming a chip package as claimed in claim 8, wherein the steps of forming the second protection layer and the conducting bump are performed after the step of etching and removing a portion of the second substrate is performed and before the step of partially removing the first substrate exposed by the through-hole to form at least one chip package is performed.

10. The method for forming a chip package as claimed in claim 1, further comprising removing the first protection layer after the through-hole is formed.

* * * * *